(12) United States Patent
Kenly et al.

(10) Patent No.: US 8,183,902 B2
(45) Date of Patent: May 22, 2012

(54) METHODS AND SYSTEMS FOR DIGITAL PULSE WIDTH MODULATOR

(75) Inventors: Stewart Kenly, Epping, NH (US); Paul W. Latham, Lee, NH (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 13/301,175

(22) Filed: Nov. 21, 2011

(65) Prior Publication Data

US 2012/0062290 A1 Mar. 15, 2012

Related U.S. Application Data

(62) Division of application No. 12/622,511, filed on Nov. 20, 2009.

(60) Provisional application No. 61/116,943, filed on Nov. 21, 2008.

(51) Int. Cl.
*H03K 7/08* (2006.01)

(52) U.S. Cl. ........ 327/172; 327/175; 327/176; 332/109; 375/238

(58) Field of Classification Search .......... 327/172–176; 332/109, 110; 375/238
See application file for complete search history.

(56) References Cited

U.S. PATENT DOCUMENTS

| | | | | |
|---|---|---|---|---|
| 6,658,583 | B1 * | 12/2003 | Kudo et al. | 713/500 |
| 7,288,977 | B2 * | 10/2007 | Stanley | 327/172 |
| 7,595,686 | B2 * | 9/2009 | Maksimovic et al. | 327/540 |
| 7,667,625 | B2 * | 2/2010 | Prodic et al. | 341/50 |
| 7,977,994 | B2 * | 7/2011 | Yousefzadeh et al. | 327/270 |
| 2005/0242858 | A1 * | 11/2005 | Figoli et al. | 327/175 |

* cited by examiner

*Primary Examiner* — Patrick O'Neill

(57) ABSTRACT

In one embodiment, the digital pulse width modulator of these teachings includes comparators and a number of phases and capable of increasing resolution without increasing clock frequency. In another embodiment, the digital pulse width modulator (DPWM) of these teachings includes equality comparators and a number of phases and increases resolution without increasing clock frequency. A further embodiment of the system of these teachings includes a priority encoded comparator component (in one instance including a number of comparators) comparing duty cycle commands against preset minimums, that embodiment being referred to as a frequency Foldback component. Other embodiments and embodiments of the method of these teachings are also disclosed.

12 Claims, 9 Drawing Sheets

METHODS AND SYSTEMS FOR DIGITAL PULSE WIDTH MODULATOR

CROSS REFERENCE TO RELATED APPLICATIONS

This application is a divisional of co-pending U.S. patent application Ser. No. 12/622,511 filed Nov. 20, 2009, which claims priority of U.S. Provisional Application 61/116,943 entitled "METHODS AND SYSTEMS FOR DIGITAL PULSE WIDTH MODULATOR," filed Nov. 21, 2008, both of which applications are incorporated by reference herein in their entirety.

BACKGROUND

These teachings relate generally to Pulse Width Modulators PWMs), and, more particularly, to Digital Pulse Width Modulators (DPWMs).

In high power applications, the PWM output is typically used to control large semiconductor switch devices, which have relatively long turn on and turn off times. One of the problems this causes is imposing a minimum and maximum duty cycle that may be realistically achieved before the resulting switch condition is constant off or on. This is referred to min/max Ton time and affects regulation ability near its limits. What is desired is a way to increase the DPWM resolution around these conditions without creating discontinuities harming overall performance.

All electronic devices emit radio frequency interference. It is a requirement that such devices pass FCC testing to ensure proper operation with other devices. It is desired to provide for a mechanism to improve compliance to EMI standards.

In typical multi-phase PWM applications, it is required that all PWM circuits be frequency locked such that they may occur at regularly predicted intervals. This permits optimal efficiency during operation. It is desired to have a mechanism to lock DPWM circuits together and pass important relationship information between them.

BRIEF SUMMARY

In one embodiment, the digital pulse width modulator of these teachings includes comparators and a number of phases and capable of increasing resolution without increasing clock frequency. In one instance, two comparators and a ramp are utilized to determine if a duty cycle is greater than or less than the ramp. In another instance, three comparators and an up/down ramp are utilized to obtain a dual edge modulator.

In another embodiment, the digital pulse width modulator (DPWM) of these teachings includes equality comparators and a number of phases and increases resolution without increasing clock frequency. In one instance, the embodiment utilizes a free running counter sufficiently larger than the PWM rate; the counter is used to test for equality between the output of the counter and a duty cycle command input. In another instance, a free running counter sufficiently larger than the PWM rate is utilized and equality between the counter output and a duty cycle command input is used for dual edge modulation.

A further embodiment of the system of these teachings includes a priority encoded comparator component (in one instance including a number of comparators) comparing duty cycle commands against preset minimums, that embodiment being referred to as a frequency Foldback component.

Other embodiments and embodiments of the method of these teachings are also disclosed.

For a better understanding of the present teachings, together with other and further needs thereof, reference is made to the accompanying drawings and detailed description and its scope will be pointed out in the appended claims.

DETAILED DESCRIPTION

One embodiment of a Digital Pulse Width Modulator (DPWM) employs a multi phase Digitally Controlled Oscillator (DCO) and Phase Locked Loop (PLL) to synchronize the DCO output clocks to a known reference. The DPWM time base consists of a free running counter that is clocked by the first phase of the DCO called ph0. The resolution is determined by the clock rate of the DCO and the number of DCO phases. In that embodiment, four phases and their compliments (eight phases) are used which results in 3 additional bits of PWM resolution. It should be noted that although in the above described embodiment a DCO and a phase locked loop where utilized to obtain a number of clock signals (phases) having a same frequency and each one clock signal having a different phase, other means for obtaining a number of clock signals are within the scope of these teachings.

Figure 1:
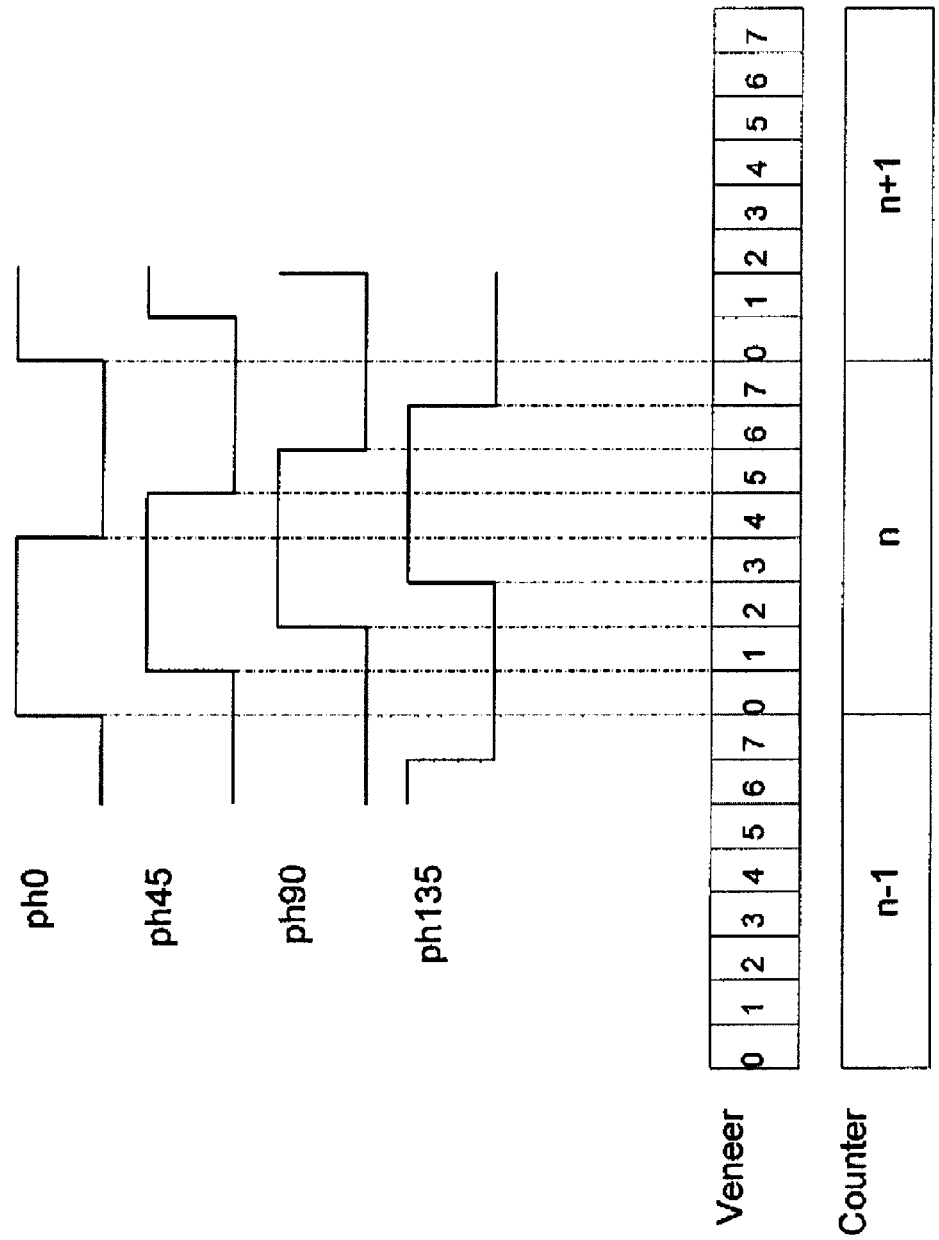
FIG. 1 illustrates how veneer increases resolution of PWM, according to an embodiment of these teachings.

In some embodiments, a 4 phase DCO based PLL is used to generate ph0, ph45, ph90 and ph135. Using clock buffers, ph180, ph225, ph270 and ph315 are derived from ph0, ph45, ph90 and ph135 respectively. These 8 phases together are herein referred to as veneer (FIG. 1)

In conventional PWM control, the control system is only able to make duty cycle corrections at fixed intervals. In a thought experiment, if a large transient occurs immediately after an update, the circuit must wait until the next interval to correct the error. With single edge modulation of these teachings, a correction is permitted once per PWM cycle. A way to improve this is to implement dual edge modulation in these teachings, thereby doubling the update rate while keeping the PWM switching period the same.

One method of implementing the above embodiment of these teachings includes comparing the duty cycle, to a counter that is the same number of bits as the desired upper coarse bits of the duty cycle. Should the counter be greater than the duty cycle, a signal called greater is asserted. Conversely, if the counter is less than the duty cycle, a signal called less is asserted. The only time both greater and less are de-asserted at the same time is when the duty cycle equals the counter. This condition permits the output of the veneer multiplexer to pass through the gates at the output of the DPWM circuit. The veneer multiplexer uses the lower bits (the lower 3 bits in the embodiment shown) of the duty cycle command as the select. The resulting PWM output resolution is the time difference between phases. (FIG. 2)

The above embodiment can be described as including a comparison component that compares the output of the counter to a signal derived from the duty cycle signal and output logic component. The comparison component has two outputs; a first output being asserted when the output of the counter is smaller than the signal to die from the duty cycle signal; a second output being asserted when the output of the counter is larger than the signal the eye from the duty cycle signal. Both first and second outputs are de-asserted when the count output equals a duty cycle signal. The output logic component received the output of the multiplexer and the first and second outputs of the comparison component and provides the time difference of the phases as the pulse width modulator output when the first and second outputs of the comparison components are de-asserted.

Figure 2:
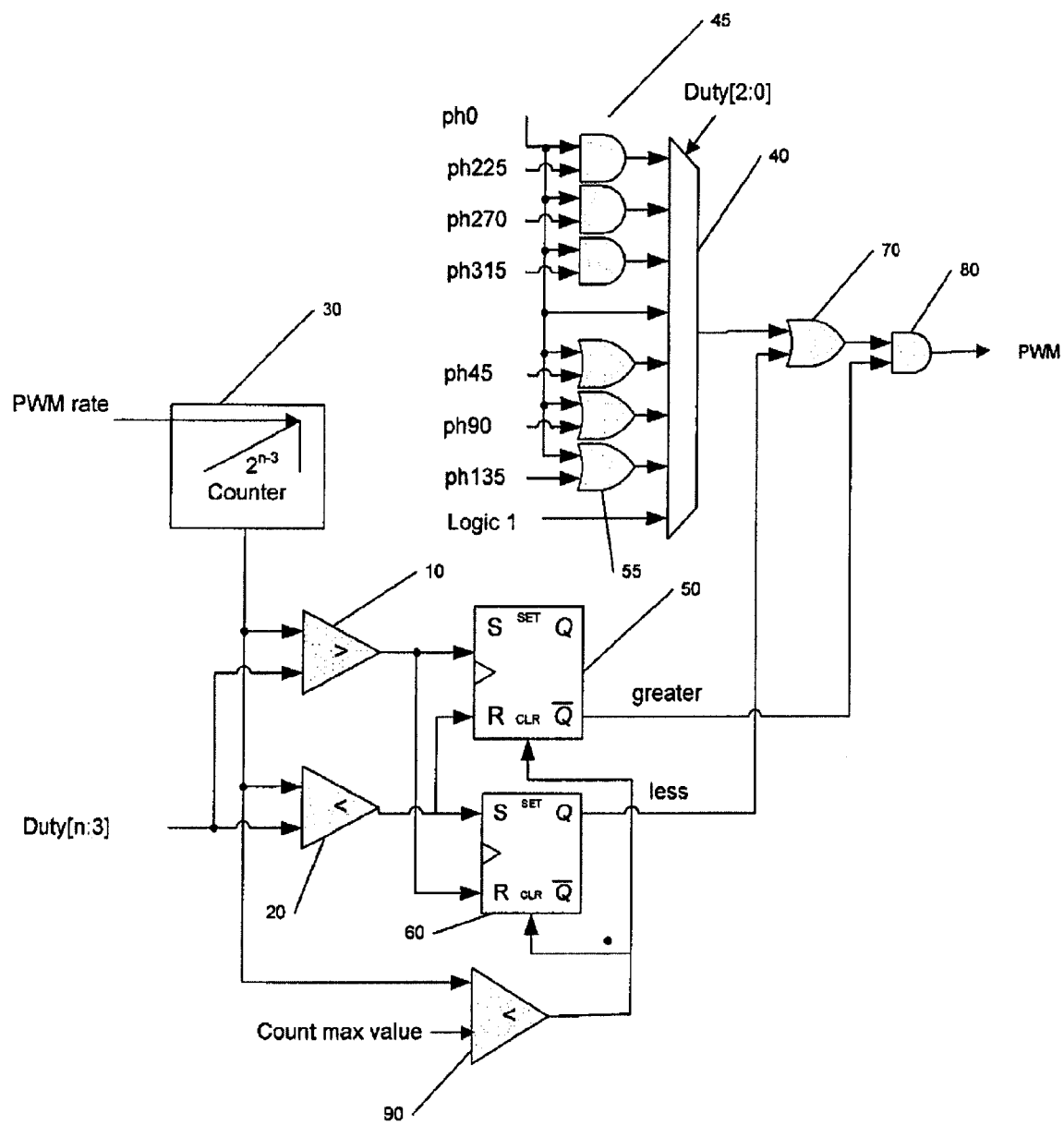
FIG. 2 is a block diagram of a circuit of these teachings.

The embodiment shown in FIG. 2 utilizes two comparators 10, 20 and a ramp (up-counter) 30 to determining if the duty cycle is greater than or less than the ramp. The embodiment shown in FIG. 2 is one example of an embodiment of the digital pulse width modulator of these teachings including comparators and a number of phases and capable of increasing resolution without increasing clock frequency.

Referring to FIG. 2, a first one 10 of the two comparators assert whether the output of the ramp (counter) 30 is larger than the duty cycle signal. A second one 20 of the two comparators assert whether the output of the counter 30 is smaller than the duty cycle signal. One bi-stable latch (flip-flop) 50 receives an output of the first comparator 10 as a set input (9) and an output of the second comparator 20 as a reset input (R). Another bi-stable latch (flip-flop) 60 receives the output of the second comparator 20 as a set input (S) and an output of the first comparator 10 as a reset input (R). The first and second comparators 10, 20 and the first and second bi-stable latches 50, 60 comprise a comparison component. A first output of the comparison component is the complement of the output ($\overline{Q}$) of the first flip-flop 50. A second output of the comparison component is the output (Q) of the second flip-flop 60. In the embodiment shown in FIG. 2, the logic component includes an OR gate 70 receiving the second output of the comparison component and the output of the multiplexer 40 and an AND gate 80 receiving the output of the OR gate 70 and the first output of the comparator component. In the embodiment shown in FIG. 2, the input to the multiplexer 40 includes a number of AND gates 45, each AND gate receiving the ph0 signal and one signal from the third and fourth quadrant—one AND gate receives ph0 and ph225, the next one receives ph0 and ph270 and the third one receives ph0 and ph315, the ph0 signal, a number of OR gates 55, each OR gate receiving the ph0 signal and one signal from the first and second quadrant-one OR gate receives ph0 and ph45, the next OR gate receives ph0 and ph90 and the last OR gate receives ph0 and ph135, and the logic 1 signal. Also in the embodiment shown in FIG. 2, another comparator 90 compares the output of the counter to the maximum count value and provides a signal to reset the flip-flops 50, 60 when the maximum count value is exceeded.

Dual Edge Veneer DPWM

Figure 3:
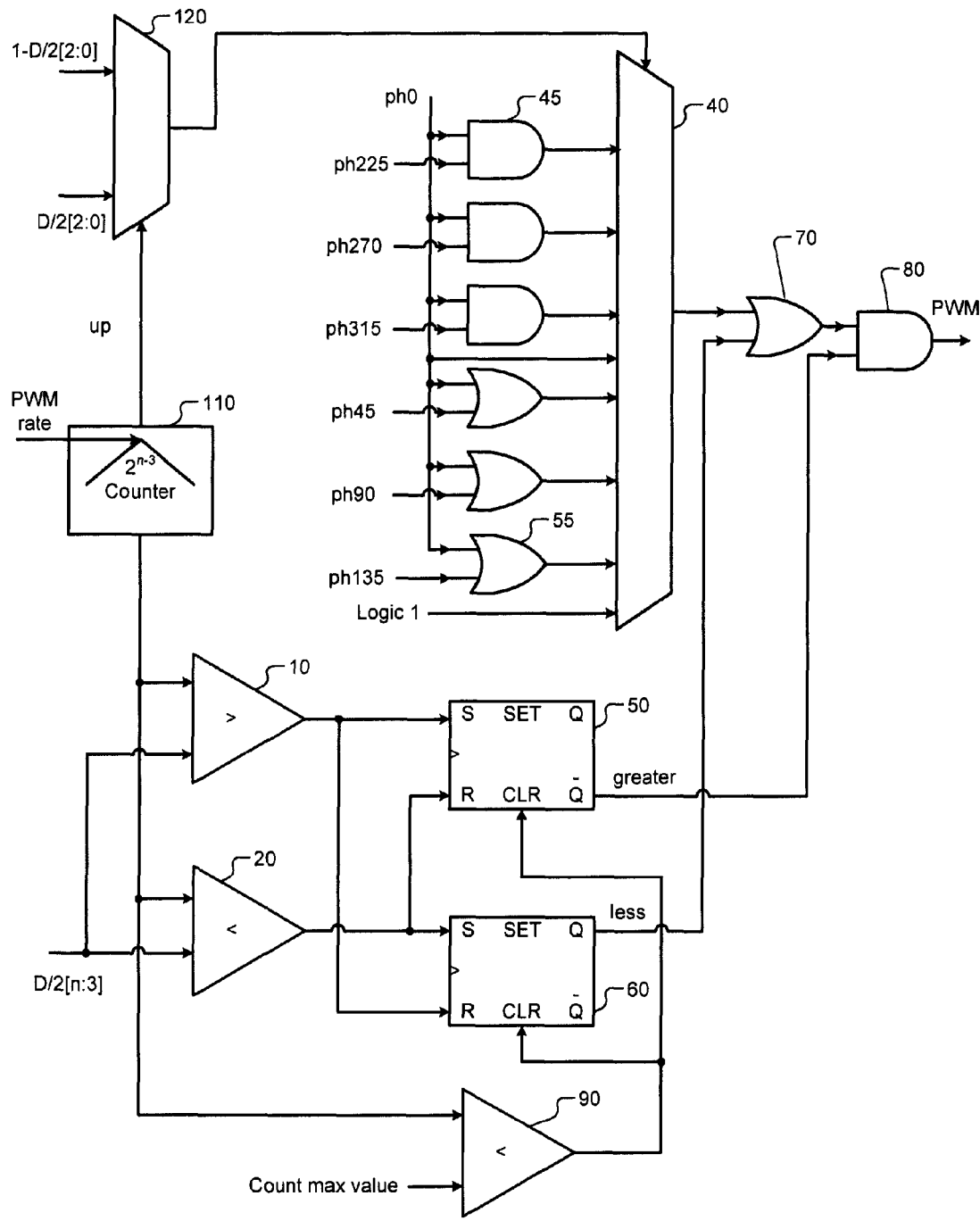
FIG. 3 is a block diagram of another circuit of these teachings.

The dual edge embodiment of the method of these teachings involves replacing the up counter with an up/down counter (110, FIG. 3). A flag generated by the counter indicating up count is used to select 1-duty*0.5 (it should be understood that 1-duty refers to fractional space; in integer space, in the embodiment shown, it will be represented by 7-duty; the signal is referred to as 1-duty hereinafter) to the veneer mux (40, FIG. 3) to accommodate the fact that increasing duty causes the rising edge to move earlier in time. This is not required for the coarse compare as it will make the same greater/less low times on the rising edge as the falling edge. (FIG. 3). The embodiment shown in FIG. 3 utilizes three comparators and an up/down ramp to obtain a dual edge modulator.

Referring to FIG. 3, the embodiment shown therein is similar to that in FIG. 2, but is that after to provide dual edge modulator. The up-down counter 110 provides a binary signal indicating an up count that is used to address another multiplexer 120. The signal derived from the duty cycle signal is substantially equal to half the duty cycle signal (duty*0.5). The other multiplexer receives one signal equal to the lower bits of duty*0.5 and another signal equal to the lower bits of 1-duty*0.5. The output of the other multiplexer 120 provides the addressing signal to the veneer multiplexer 40. The input to the two comparators 10, 20 in the comparator component is substantially half the duty cycle signal (duty*0.5).

Single Edge Flop based DPWM

An additional embodiment of the PWM of these teachings includes all synchronous design elements. This is preferable for automated digital design flows that perform static timing analysis and would not be able to close timing on the previous implementation method due to various combinational paths that contribute to the same output.

Regardless of single edge or dual edge modulation, the implementation is fundamentally similar. A free running counter of n bits is clocked off the ph0 clock and serves as the coarse time base for the DPWM circuit. The duty cycle is added to the present value of count and latched at the PWM interval which is derived from the counter. Using an equality operator, it is possible to make multiple PWM rates that are binary multiples of the base counter rate. The PWM rate is decoded into triggers called Full Cycle (FC) for the single edge modulated case and Full Cycle (FC)/Half Cycle (HC) for the dual edge modulated case.

The single edge modulator uses one equality compare between duty latch and the counter. At the FC trigger point, which corresponds with the PWM cycle interval, a memory device is set to the state of logic 1. In this embodiment a clocked Set/Reset flop is used for the memory device. When the counter ramp equals the duty+count value the memory device is set to the state f logic 0. This generated signal is referred to as the coarse PWM signal because it is at the resolution of one ph0 clock.

At the point the coarse PWM signal is set to 0, the lower bits of the duty cycle are latched and used to select an input to an 8 input multiplexer. The 8 inputs to the multiplexer are the coarse PWM signal as clocked by sequentially increasing phases. The result is the final HS pulse shifted forward in time by the desired phase clock or veneer selection. (FIG. 4).

Figure 4:
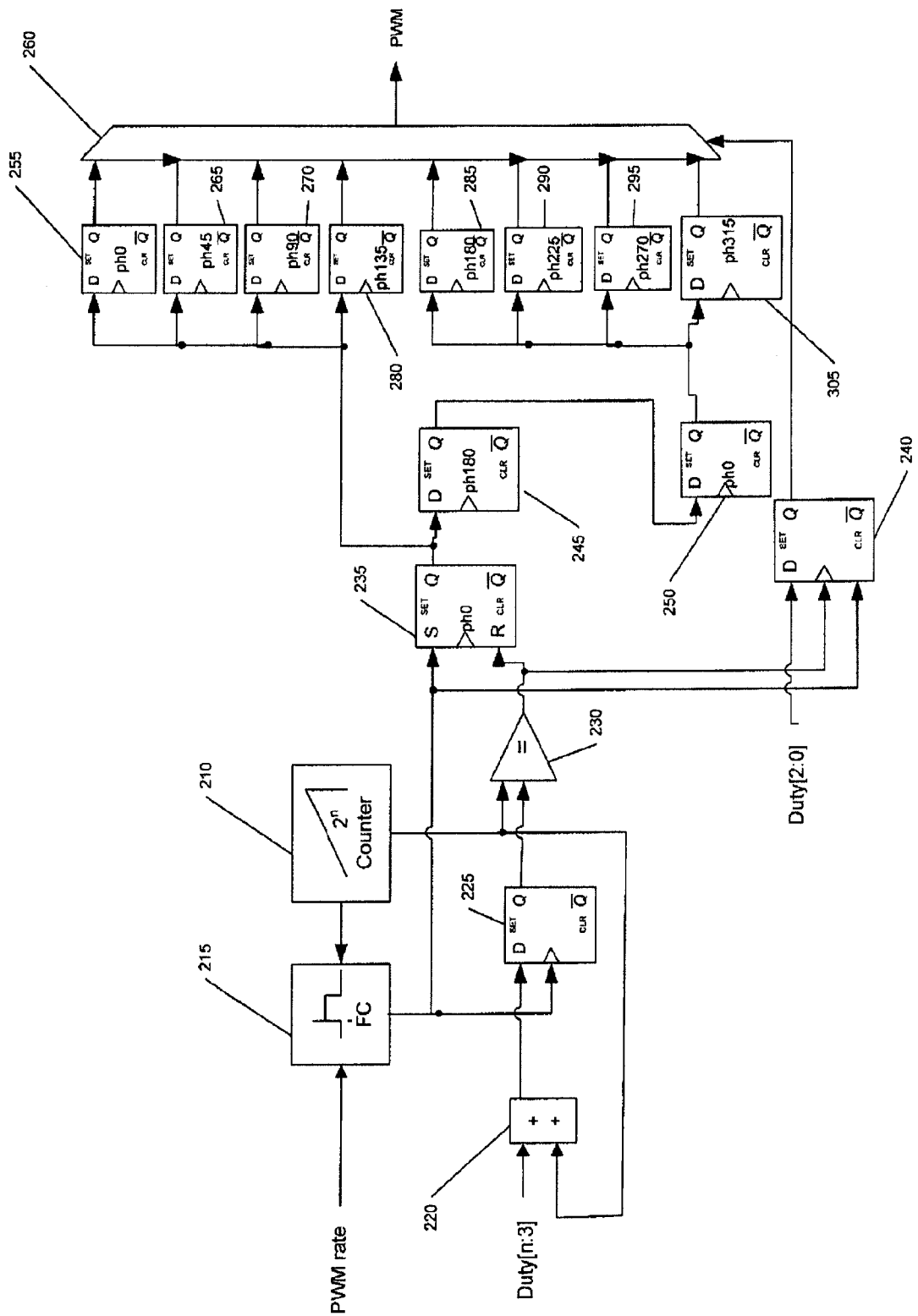
FIG. 4 is a block diagram of a system of these teachings.

In the embodiment shown in FIG. 4, the digital PWM utilizes a free running counter 210 sufficiently larger than the PWM rate; the counter 210 is used to test for equality between the output of the counter and a duty cycle command input. The embodiment shown in FIG. 4 provides single-edge modulation. The embodiment shown in FIG. 4 is one of the embodiments utilizing equality comparisons and a number of phases to increase resolution without increasing clock frequency.

Referring to FIG. 4, the output of the counter 210 and the duty cycle signal are provided to an adding component 220. The output of the adding component 220 is provided to a digital delay component (a D flip-flop in the embodiment shown) 225. The digital delay component 225 is clocked by a trigger signal generated by a trigger generating (decoding) component 215. The trigger signal corresponds to, in the embodiment shown, a PWM cycle interval. An equality comparator 230 receives the output of the counter 210 and the output of the digital delay component 225. A digital memory component 235 (a flip-flop in the embodiment shown) receives the trigger signal corresponding to the PWM cycle interval (in the embodiment shown) and his reset by the output of the equality comparator 230. A multiplexer 260 having as input signal derived from the number of phases (ph0. ph45, ph 90, ph 135, ph180, ph225, ph270, ph315) provides the output of the pulse width modulator. An addressing signal for the multiplexer 260 is obtained from the lower bits of the duty cycle signal. In the embodiment shown in FIG. 4, another digital delay component 240 (a D flip-flop in the embodiment shown) received as inputs the lower bits are doing cycle signal and is clocked by an output of the equality comparator 230. The output of the digital delay component 240 provides the addressing signal to the multiplexer 260. In the embodiment shown in FIG. 4, the input to the multiplexer 260 includes a number of other digital delay components (D flip-flops in the embodiment shown) 255, 265, 270, 280, 285, 290, 295, 305. A first-half of the other digital delay components receives as input and output signal of the digital memory 235. Each one of the other digital delay components is clocked by a successive phase. The first other digital delay component 255 is clocked by ph0; the next digital delay component 265 is clocked by ph45; and so on (each successive digital delay component in the input to the multiplexer 260 is labeled by the clocking phase). The second half of the other digital delay components receives as input a signal derived from the output of the digital memory component 235. In the embodiment shown in FIG. 4, the output of the digital memory 235 is provided as input to a further digital delay component 245 and the output of that digital delay component 245 is provided as input to a last digit of the component 250. The output of that last digital data component 250 is input to the second half of the other deep in a components 285, 290, 295, 305.

Dual Edge Flop Based DPWM

The dual edge modulator differs slightly from the single edge modulator as it uses an additional equality compare between the quantity (1-duty) and the counter. This is due to the rising edge of the PWM output moves earlier in time as duty cycle increases whereas the falling edge of the PWM output moves forward in time as duty cycle increases. When the sum of (1-Duty)+counter latched equals the counter present value, a memory device is set to the state of logic 1. In this embodiment a clocked Set/Reset flop is used for the memory device. When the sum of duty+count latched equals the counter present value the memory device is set to the state of logic 0.

Figure 5:
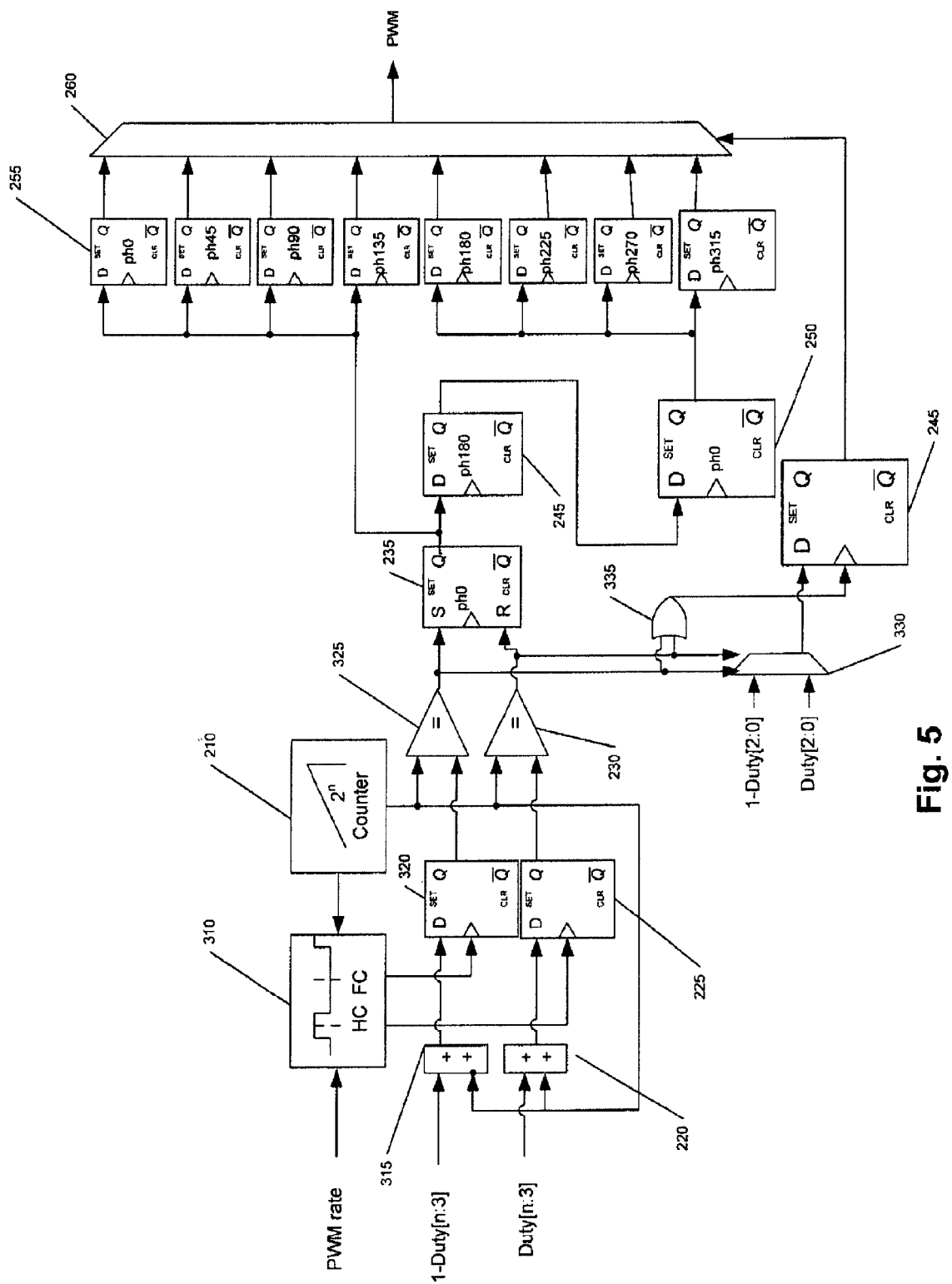
FIG. 5 is a block diagram of another system of these teachings.

Given the dual edge nature of this implementation, the lower bits of the duty cycle should be swapped to match the edge that the veneer circuit should generate. This is accomplished by the multiplexer prior to the duty latches. The output of this latch is used to select which veneer value should ultimately generate the PWM output. (FIG. 5). The embodiment shown in FIG. 5 utilizes a free running counter sufficiently larger than the PWM rate used to test for equality between the counter output and a duty cycle command input for dual edge modulation.

Referring to FIG. 5, the embodiment shown therein differs from the embodiment shown in FIG. 4 only in those details necessary to implement the dual edge modulation. The trigger generating component 310 generates a trigger signal corresponding to half the PWM cycle interval and the trigger signal corresponding to the PWM cycle interval. The digital delay component 225 is triggered by the trigger signal corresponding to half the PWM cycle interval. Another adding component 315 receives a signal equal to 1-Duty (in the rational representation) and the output of the counter 210. The output of the other adding component 315 is provided to another digital delay component 320, the other digital delay component 320 being triggered by a trigger signal corresponding to the PWM cycle interval. Another equality comparator 325 received the output of the other digital delay component 320 and the counter output. The memory component 235 receives as input the output of the other equality comparator 325. Another multiplexer 330 receives a signal equal to the lower bits of the duty cycle signal and a signal equal to the lower bits of 1-duty. The other multiplexer 330 is addressed by the output of the equality comparator 230 and the other equality comparator 325. The output of the other multiplexer 330 is utilized to generate the addressing signal for the first multiplexer 260. In the embodiment shown in FIG. 5, the outputs of the two equality competitors 230, 325 are provided to an OR gate. The output of the other multiplexer 330 is provided as input to the digital delay component 245 (a D flip-flop in the embodiment shown), the digital delay component 245 being triggered by the output of the OR gate.

Frequency Foldback

In the event a DPWM of the type described earlier is used to drive large silicon switch devices for power applications, a mechanism to ensure minimum Ton time is desired to increase the effective control resolution at the endpoints of the duty cycle. To this end, a mechanism to detect a duty cycle command that would cause a min/max Ton time violation is implemented ahead of the DPWM block. The resulting binary dividing of the DPWM frequency is referred to as foldback.

Figure 6:
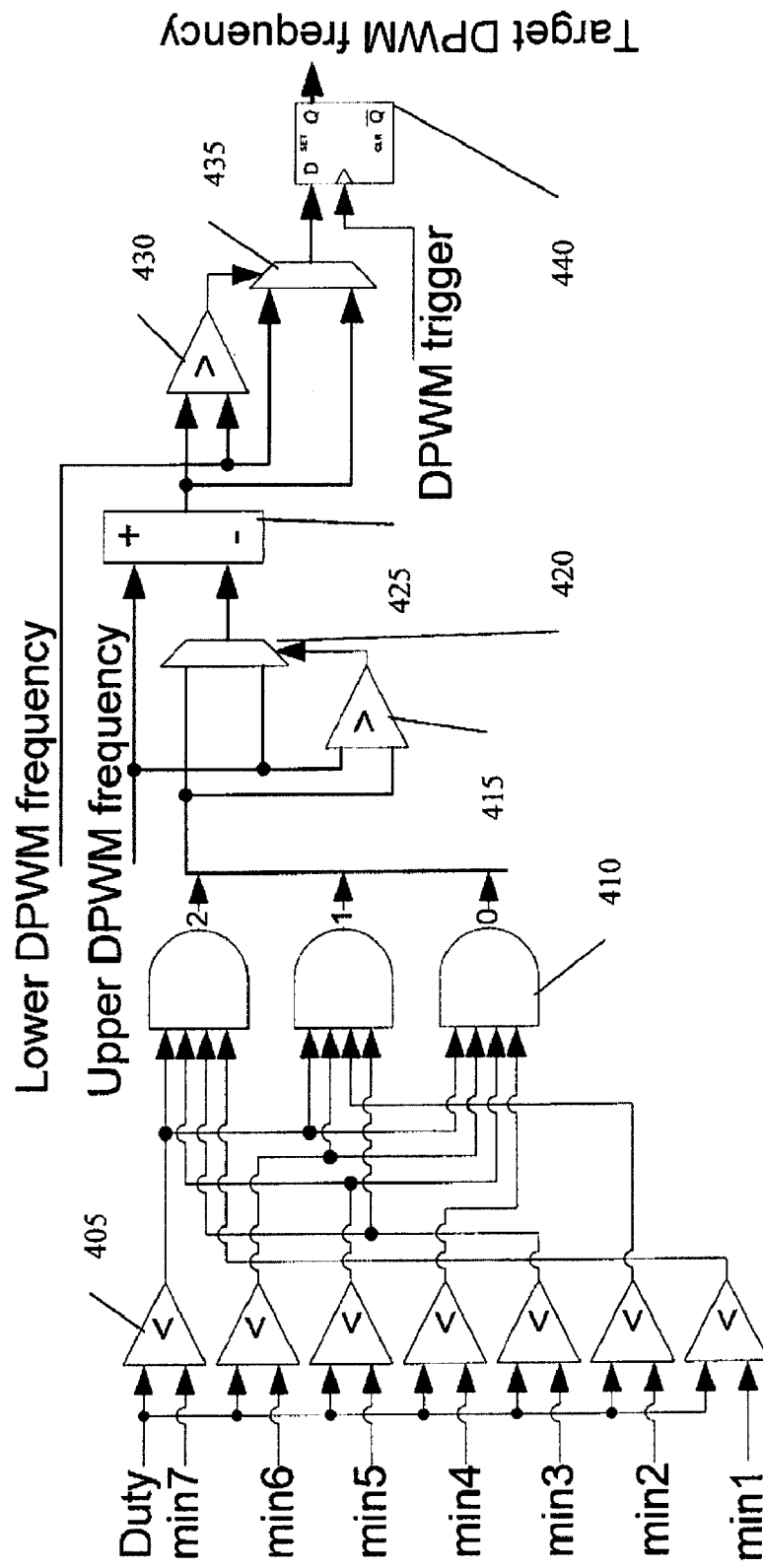
FIG. 6 is a block diagram of another circuit of these teachings.

As the duty cycle gets smaller, one or more of the 7 comparators (in the embodiment shown in FIG. 6, not a limitation of these teachings), will assert true. This is decoded by a priority encoder into a 3 bit (in this embodiment, but not a limitation of these teachings; other number of bits are within the scope of these teachings) foldback value. This is clamped between the upper operating value, or the nominal PWM frequency and the lower operating value. To ensure glitch free operation, the foldback value is latched at the Full Cycle (FC) trigger point. The foldback value is passed to the DPWM block and is used to properly control the timebase. (FIG. 6). In the embodiment shown in FIG. 6, a priority encoded comparator component (in one instance including a number of comparators) is utilized to compare duty cycle command against preset minimums to successively half DPWM switching frequency in order to ensure substantially minimum Ton time.

Referring to FIG. 6, each one of a number of comparators 405 receives a duty cycle signal and a different threshold; each compiled for asserting whether the duty cycle signal is less than the respective threshold. The outputs of the comparators 405 are provided as input to a priority encoder 410, the output of the priority encoder 410 is the fold back value to a predetermined number of bits. A clamping component clamps the fold back value between an upper operating value and a lower operating value. In the embodiment shown in FIG. 6, the clamping component comprises a first multiplexer 420 receiving the fold back value and the upper PWM frequency, the first multiplexer 420 being triggered by the output of a first comparator 415, the first comparator 415 asserting whether the upper PWM frequency is greater than the fold back value. The output of the first multiplexer being subtracted from the upper PWM frequency by subtraction component 425. A second multiplexer 435 receives the output of the subtraction component 425 and the lower PWM frequency. The second multiplexer 435 is addressed by the output of a second comparator 430, the second comparator 430 being asserting whether the output of the subtraction component 425 is greater than the lower PWM frequency.

The output of the second multiplexer 435, the clamped fold back value, is the input to a digital delay component 440 triggered at a trigger signal corresponding to a nominal PWM cycle interval (FC).

Duty Cycle Dither Interpolator

An additional method for increasing the effective resolution of the DPWM output includes wiggling the least significant bit of the duty cycle command in such a way as to create on average the perfect duty cycle output. This is accomplished by a simple first-order sigma-delta modulator. This implementation is typically integrated with the previously mentioned frequency foldback system. This embodiment of the method of these teachings improves upon duty cycle interpolation by dynamically scaling the duty cycle input based on frequency foldback.

Figure 7:
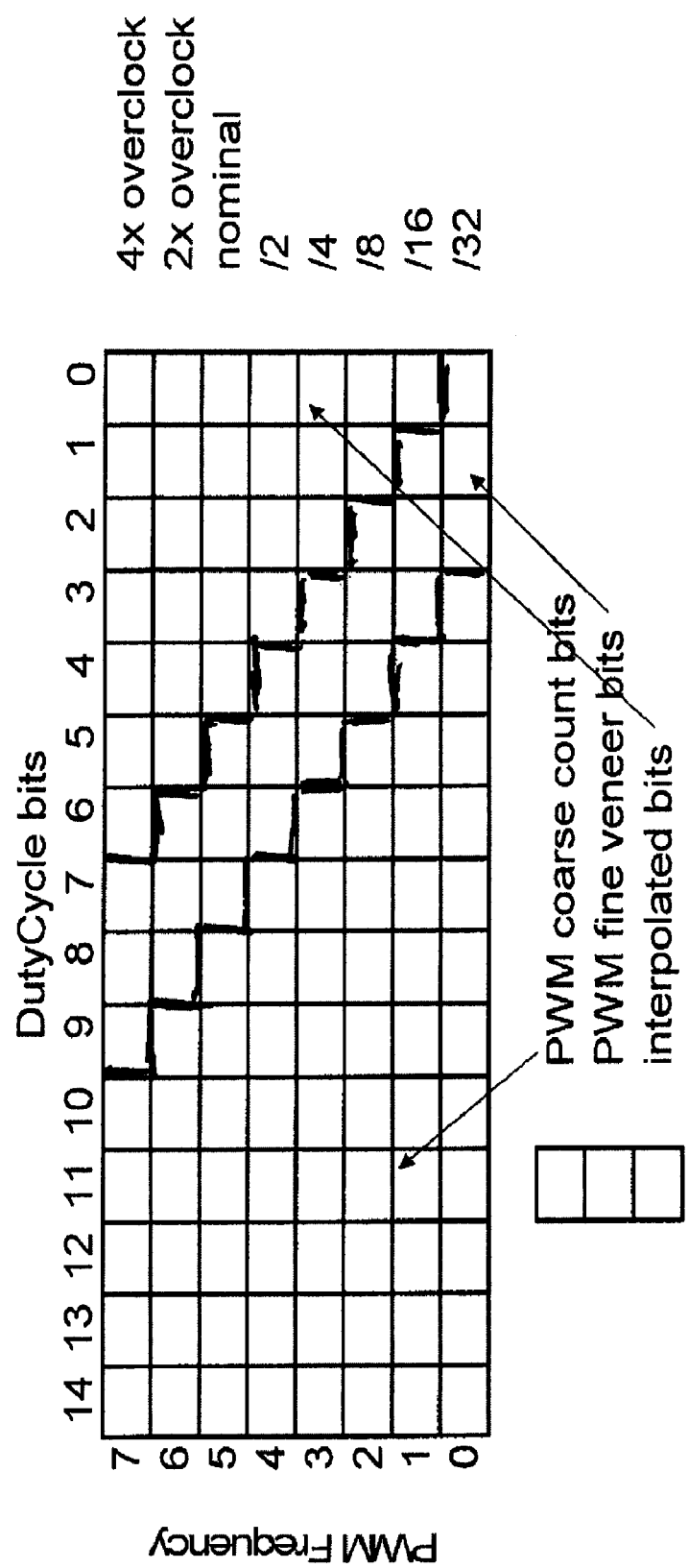
FIG. 7 is a chart showing effects of changing PWM switching frequency on bits of resolution according to an embodiment of these teachings.
Figure 8:
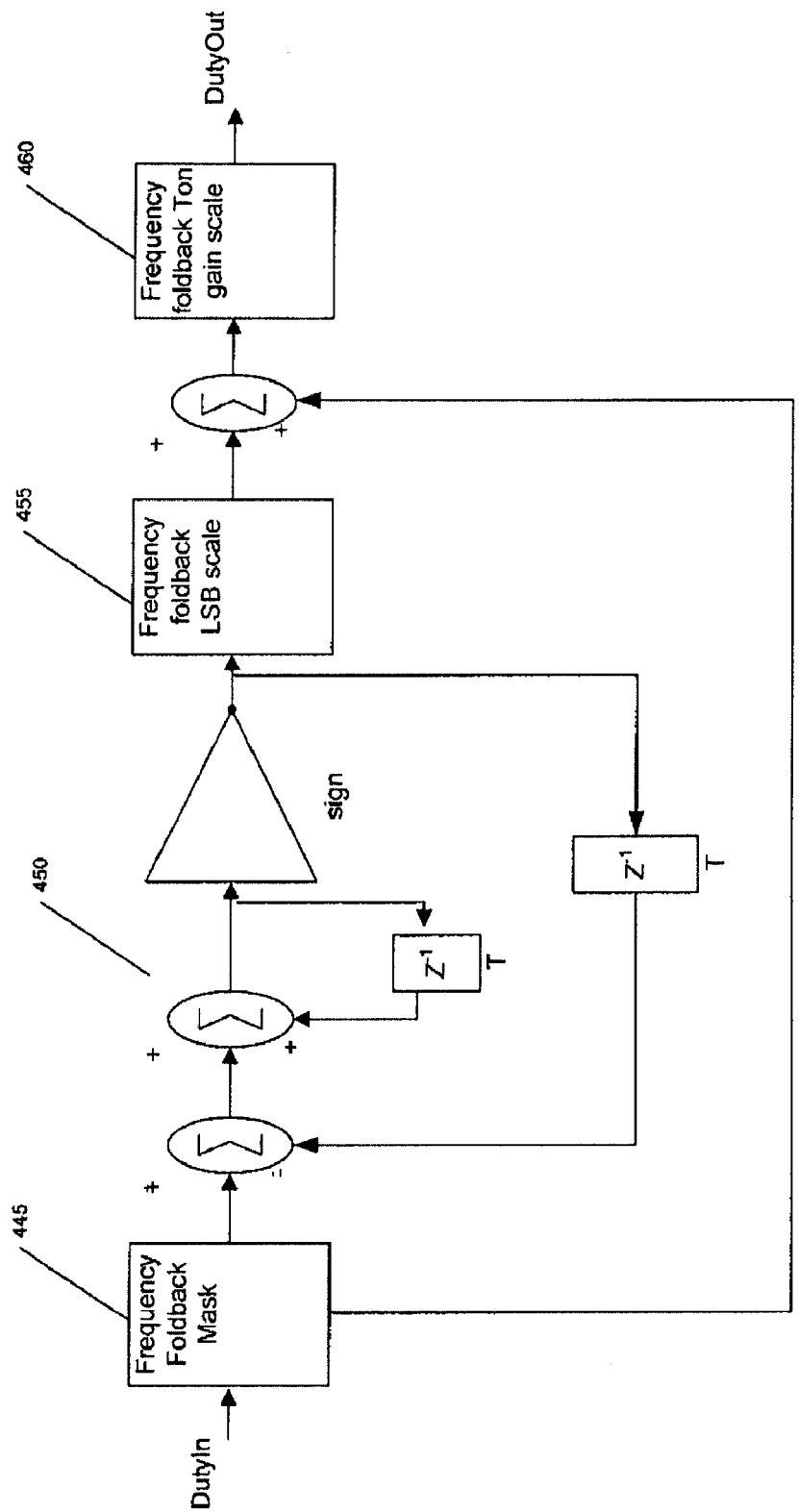
FIG. 8 is a block diagram of another system of these teachings.

As the frequency foldback circuit changes the DPWM switching frequency, a tradeoff is made between real bits of resolution and interpolated bits of resolution. In the exemplary DPWM circuit, the duty cycle is 16 bits (not a limitation of these teachings). The chart below shows that, for the exemplary embodiment, at upper frequency limit of 7, there are 7 bits of interpolated resolution. The number of interpolated bits is decreased as the switching frequency of the PWM is lowered. (FIG. 7). FIG. 7 provides an exemplary embodiment of the masks that are generated from the fold back value. The interpolated bits in FIG. 7 change as a function of the fold back value and the section of FIG. 7 labeled interpolated bits is an exemplary embodiments of the frequency fold back mask (445, FIG. 8) used to provide the number and location of bits to be dithered to an interpolator. The region of FIG. 7 labeled PWM fine veneer bits is an exemplary embodiment of a mask of the veneer bits that are added at the output of the interpolator (455, FIG. 8). The Sigma-Delta modulator is an exemplary embodiment of an interpolator (450, FIG. 8) and is based on the previously filed U.S. Patent Publication 20070182610—Systems and Methods for Digital Control, which is incorporated by reference herein in its entirety. This version of the Sigma Delta interpolator is single order and has logic to dynamically scale the duty cycle based on frequency foldback. (FIG. 8). The logic to dynamically scale the duty cycle based on the frequency fold back operates on the sum of the dither and veneer values and the coarse values of the duty cycle and scales the sum appropriately based on the fold back value (460, FIG. 8). The embodiment shown in FIG. 8 includes a sigma delta modulator and a number of frequency foldback subsystems (such as those shown in FIGS. 6, 7).

Phase Locked Loop Spread-Spectrum DPWM Timing Generator

As discussed earlier, a 4 phase digitally controlled oscillator is used to generate the first four phases for the DPWM logic with clock inverters to generate the other four. The preferred architecture for the DCO (510, FIG. 9) is a simple ring oscillator due to stable phase relationships and its ability to be tuned by a control voltage over a large dynamic range. A digital to analog converter (DAC) (520, FIG. 9) is used to convert the digital control word to an analog control voltage. The ph0 output of the DCO is connected to an integer divider (525, FIG. 9) that is set nominally by a fixed number. This nominal divider value is what ultimately determines what the DCO output frequency will be. The feedback divider nominal value is modulated by a up/down ramp counter (545, FIG. 9) that has parameters to select the magnitude and period of the ramp. This permits the user to tune the spread spectrum operation for a specific application. The advantage of introducing spread spectrum to the feedback path is it easily accommodates switching to an external sync input.

Figure 9:
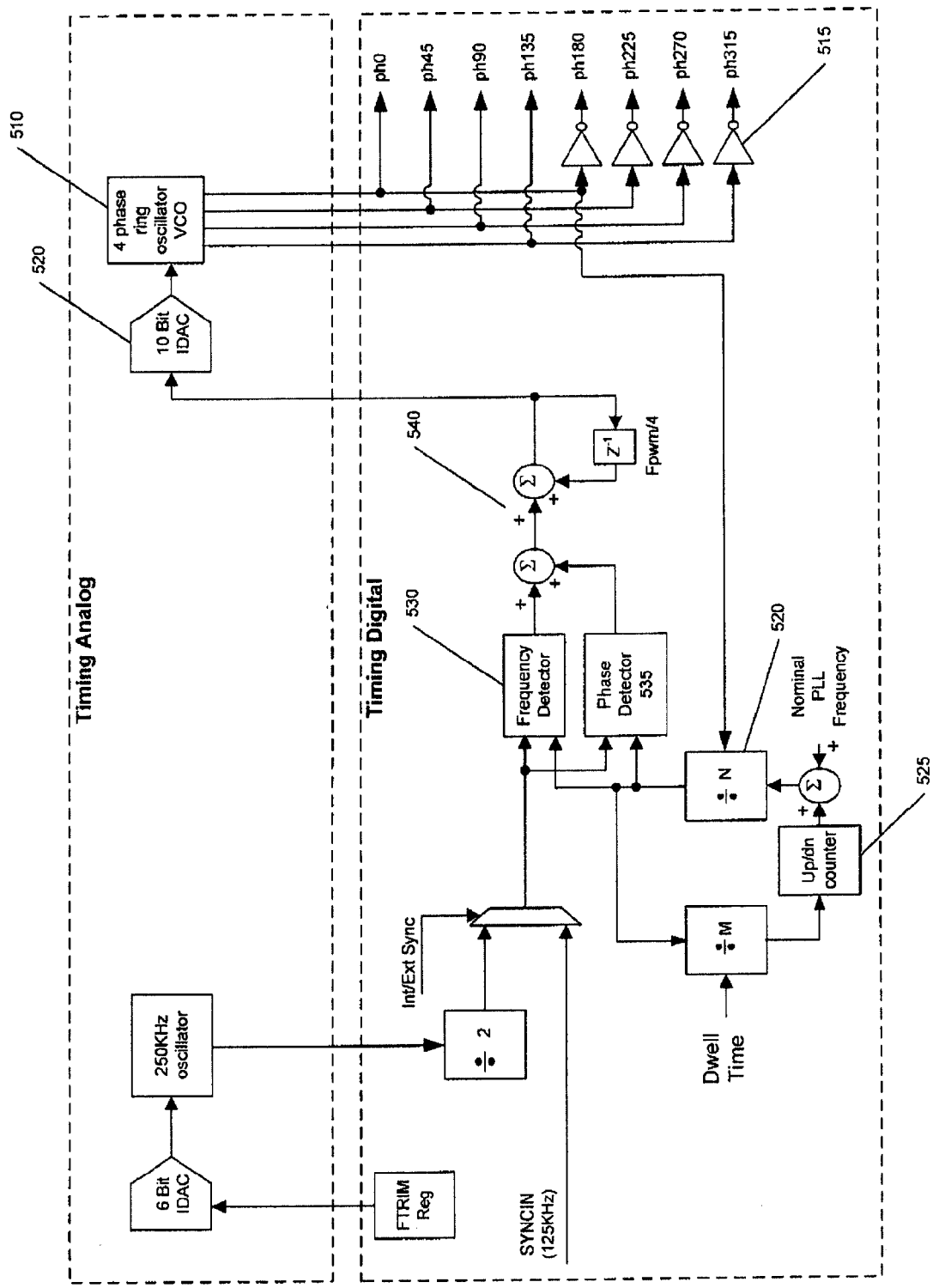
FIG. 9 is a block diagram of another system of these teachings.

The Digital Phase Locked Loop consists of a frequency detector (530, FIG. 9), a phase detector (535, FIG. 9) and an integrator (540, FIG. 9). There is a circuit that constantly monitors the output of the frequency detector and when the DCO frequency is within 15% of the target frequency the frequency detector is removed from the loop. The circuit will then lock phase only which results in a much more stable output due to the removed interaction between the frequency and phase detectors. (FIG. 9). The embodiment shown in FIG. 9 implements spread spectrum in the feedback path of the Phase Locked Loop in order to dither PWM switching output.

Although these teachings have been described with respect to various embodiments, it should be realized these teachings is also capable of a wide variety of further and other embodiments within the spirit and scope of the appended claims.

What is claimed is:

1. A pulse width modulator comprising:
    a first multiplexer that receives a plurality of combined clock signals and that selects one of the plurality of combined clock signals based on a select signal,
    wherein the combined clock signals are based on a plurality of clock signals having the same frequency and different phases;
    an up-down counter having a maximum count value; and
    a second multiplexer that outputs one of a first signal and a second signal as the select signal based on an output of the up-down counter,
    wherein the first signal is based on a first group of bits of one-half of a duty cycle and the second signal is based on a second group of bits of 1 minus one-half of the duty cycle.

2. The pulse width modulator of claim 1, further comprising a comparing component that selectively generates an increase output and a decrease output based on a third group of bits of the duty cycle and the output of the up-down counter.

3. The pulse width modulator of claim 2, wherein the comparing component comprises:
    a first comparator that determines whether the output of the up-down counter is greater than the third group of bits of the duty cycle; and
    a second comparator that determines whether the output of the up-down counter is less than the third group of bits of the duty cycle.

4. The pulse width modulator of claim 3, wherein the comparing component comprises:
    a first latch that receives outputs of the first comparator and the second comparator; and
    a second latch that receives outputs of the first comparator and the second comparator.

5. The pulse width modulator of claim 4, wherein:
    the first latch includes a set input and a reset input and receives the output of the first comparator at the set input and the output of the second comparator at the reset input; and
    the second latch includes a set input and a reset input and receives the output of the second comparator at the set input and the output of the first comparator at the reset input.

6. The pulse width modulator of claim 5, further comprising:
    a third comparator that selectively clears the first latch and the second latch based on the output of the up-down counter and the counter maximum value.

7. The pulse width modulator of claim 4, further comprising:
   a first logic circuit receiving an output of the first multiplexer and an output of the second latch; and
   a second logic circuit receiving an output of the first logic circuit and an output of the first latch.

8. The pulse width modulator of claim 7, wherein the first logic circuit comprises an OR gate and the second logic circuit comprises an AND gate.

9. The pulse width modulator of claim 7, wherein the output of the first latch is a complementary output and the output of the second latch is a non-complementary output.

10. The pulse width modulator of claim 4, wherein the first latch and the second latch include a bistable latch.

11. The pulse width modulator of claim 1, wherein a selected one of the plurality of combined clock signals provides a resolution of an output of the pulse width modulator.

12. A system comprising:
   the pulse width modulator of claim 1,
   a multiphase digitally controlled oscillator (DCO) that generates the plurality of clock signals; and
   a phased locked loop (PLL) that synchronizes the plurality of clock signals generated by the DCO with a clock reference.

* * * * *

UNITED STATES PATENT AND TRADEMARK OFFICE
CERTIFICATE OF CORRECTION

PATENT NO. : 8,183,902 B2
APPLICATION NO. : 13/301175
DATED : May 22, 2012
INVENTOR(S) : Stewart Kenly et al.

Page 1 of 1

It is certified that error appears in the above-identified patent and that said Letters Patent is hereby corrected as shown below:

| | |
|---|---|
| Column 3, Line 31 | Delete "(9)" and insert --(S)-- |
| Column 5, Line 6 | Delete "his" and insert --is-- |
| Column 5, Line 8 | Delete "signal" and insert --signals-- |
| Column 5, Line 9 | Delete "." and insert --,-- |
| Column 5, Line 9 | Delete "ph 90" and insert --ph90-- |
| Column 5, Line 9 | Delete "ph 135" and insert --ph135-- |
| Column 7, Line 64 | Delete "a" and insert --an-- |
| Column 8, Line 16 | Delete "is" and insert --are-- |

Signed and Sealed this
Sixth Day of November, 2012

David J. Kappos
*Director of the United States Patent and Trademark Office*